(12) United States Patent
Lee et al.

(10) Patent No.: US 8,941,195 B2
(45) Date of Patent: Jan. 27, 2015

(54) SEMICONDUCTOR DEVICE HAVING INSULATING LAYER FORMED THROUGH OXIDIZATION OF ELECTRODE

(75) Inventors: Min Suk Lee, Seongnam-si (KR); Bo Kyoung Jung, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 255 days.

(21) Appl. No.: 13/336,174

(22) Filed: Dec. 23, 2011

(65) Prior Publication Data
US 2013/0037895 A1    Feb. 14, 2013

(30) Foreign Application Priority Data

Aug. 9, 2011  (KR) .......................... 10-2011-0078971

(51) Int. Cl.
| | | |
|---|---|---|
| H01L 29/82 | (2006.01) | |
| G11B 5/33 | (2006.01) | |
| G11B 5/127 | (2006.01) | |
| H01L 43/08 | (2006.01) | |
| H01L 43/10 | (2006.01) | |
| H01L 43/12 | (2006.01) | |

(52) U.S. Cl.
CPC ................ *H01L 43/08* (2013.01); *H01L 43/10* (2013.01); *H01L 43/12* (2013.01)
USPC ............ 257/421; 257/E29.323; 257/E21.002; 360/324; 360/324.11; 360/324.12; 360/324.2

(58) Field of Classification Search
None
See application file for complete search history.

(56) References Cited

U.S. PATENT DOCUMENTS

2005/0104102 A1* 5/2005 Fukuzumi ..................... 257/295

* cited by examiner

*Primary Examiner* — Michael Jung
(74) *Attorney, Agent, or Firm* — IP & T Group LLP

(57) ABSTRACT

In a method for fabricating a semiconductor device, a conductive layer is formed on a substrate, where the substrate has a bottom layer formed thereon. A magnetic tunnel junction layer is formed on the conductive layer. The magnetic tunnel junction layer is patterned using an etching gas containing oxygen. An insulating layer is formed by oxidizing the conductive layer exposed outside the patterned magnetic tunnel junction layer using the etching gas.

5 Claims, 5 Drawing Sheets

SEMICONDUCTOR DEVICE HAVING INSULATING LAYER FORMED THROUGH OXIDIZATION OF ELECTRODE

CROSS-REFERENCE TO RELATED APPLICATIONS

The present application claims priority of Korean Patent Application No. 10-2011-0078971, filed on Aug. 9, 2011, which is incorporated herein by reference in its entirety.

BACKGROUND

1. Field

Exemplary embodiments of the present invention relate to a method for fabricating a semiconductor device, and more particularly, to a method for fabricating a semiconductor device, which can prevent an etching defect caused in a process of fabricating a magnetic tunnel junction pattern.

2. Description of the Related Art

A dynamic random access memory (DRAM) is a representative semiconductor memory having characteristics of high-speed operation and high integration. On the other hand, the DRAM being a non-volatile memory loses data when power is turned off, and refresh of data is continuously performed during the operation of the DRAM. Therefore, the DRAM has a large power loss. On the other hand, a flash memory, while having characteristics of non-volatility and high integration, has a slow operating speed. As another example of a semiconductor memory, a spin transfer torque random access memory can be highly integrated while having characteristics of non-volatility and high-speed operation.

The spin transfer torque random access memory refers to a non-volatile memory that stores data in a magnetoresistive element using a change in magnetoresistance depending on a magnetization direction between ferromagnetic substances. In the magnetoresistive element, the resistance of a cell is decreased when the spin directions (i.e., magnetic momentum directions) of two magnetic layers are identical to each other, and the resistance of the cell is increased when the spin directions of the two magnetic layers are opposite to each other. Accordingly, data is stored using the fact that the resistance of the cell is changed depending on a magnetization state of the magnetic layers in the magnetoresistive element. As the magnetoresistive element, a magnetic tunnel junction (MTJ) may be used.

The spin transfer torque random access memory with an MTJ structure is generally formed as a structure in which a first ferromagnetic layer, an insulating layer and a second ferromagnetic layer are laminated. When electrons passing the first ferromagnetic layer pass through the insulating layer used as a tunneling barrier, the tunneling probability is changed depending on a magnetization direction of the second ferromagnetic layer. That is, tunneling current is maximized when the magnetization directions of the two magnetic layers are parallel to each other, and the tunneling current is minimized when the magnetization directions of the two magnetic layers are opposite to each other. For example, it may be determined that '1' (or '0') is recorded as data when resistance set by the tunneling current is large and '0' (or '1') is recorded as the data when the resistance set by the tunneling current is small. Here, one of the two magnetic layers is referred to as a fixed magnetic layer and has its magnetization direction fixed, and the other of the two magnetic layers is referred to as a free magnetic layer and has its magnetization direction reversed by an external magnetic field or current.

Since the spin transfer torque random access memory is in the initial process of development, there are several issues to be addressed in a patterning process. For example, in a process of patterning and subsequently cleaning a magnetoresistive element, a tunnel insulating layer interposed between two ferromagnetic layers may be lost or the ferromagnetic layer may be exposed to the outside. Therefore, it is useful to develop a process of fabricating the spin transfer torque random access memory that addresses such issues.

SUMMARY

An embodiment of the present invention is directed to a method for fabricating a semiconductor device, which can prevent an etching defect caused in a process of fabricating a magnetic tunnel junction pattern.

In accordance with an embodiment of the present invention, a method for fabricating a semiconductor device includes forming a conductive layer on a substrate, wherein the substrate has a bottom layer formed thereon, forming a magnetic tunnel junction layer on the conductive layer, patterning the magnetic tunnel junction layer using an etching gas containing oxygen, and forming an insulating layer by oxidizing the conductive layer that is exposed outside the patterned magnetic tunnel junction layer using the etching gas.

In accordance with another embodiment of the present invention, a semiconductor device includes an insulating layer; a contact plug and a first electrode that are each stacked in a hole penetrating the insulating layer; a second electrode formed on the first electrode; a magnetic tunnel junction element formed on the second electrode; a third electrode formed on the magnetic tunnel junction element; and a metal oxidation layer formed around the third electrode, wherein the metal oxidation layer and the third electrode each include a same metal.

In a method for fabricating a semiconductor device having a magnetic tunnel junction in accordance with the present invention, since a lower electrode layer is not separated through etching but through oxidation, an etching failure due to loss of an etching margin is prevented. Further, since a second lower electrode layer is not etched, etching damage of an upper electrode pattern is reduced.

DETAILED DESCRIPTION

Figure 1A:
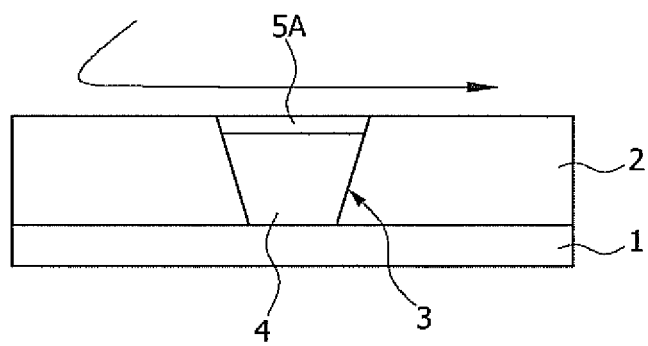
FIGS. 1a to 1e are sectional views illustrating a method for fabricating a spin transfer torque RAM (STTRAM).

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIGS. 1a to 1e are sectional views illustrating a method for fabricating a spin transfer torque RAM (STTRAM).

As illustrated in FIG. 1a, a first interlayer insulating layer 2 is formed on a substrate having a bottom layer 1 formed thereon.

A transistor for selecting a magnetic tunnel junction is disposed on the bottom layer 1.

The first interlayer insulating layer 2 functions to insulate layers or elements from each other. To this end, the first interlayer insulating layer 2 may be at least one of a boro silicate glass (BSG) layer, a boro phospho silicate glass (BPSG) layer, a phosphor silicate glass (PSG) layer, a tetra ethyl ortho silicate (TEOS) layer, a high density plasma (HDP) oxide layer and a spin on glass (SOG) layer.

Subsequently, a first contact hole 3 is formed by selectively etching the first interlayer insulating layer 2. The first contact hole 3 may be formed in a circular or polygonal shape.

Subsequently, a first contact plug 4 that contacts a source/drain region (S/D) is formed by burying a conductive layer in the first contact hole 3. In this case, an excessive etching process is performed on the conductive layer, so that a portion of the upper part of the first contact hole 3 is exposed. The first contact plug 4 electrically connects the source/drain region (S/D) of the transistor and the magnetic tunnel junction to each other.

Subsequently, a first lower electrode layer 5A is buried in the exposed portion of the upper part of the first contact hole 3. That is, the first lower electrode layer 5A completely filled in the first contact hole 3 is formed by depositing TiN on the substrate and subsequently performing a planarization process. Here, the planarization process may be a chemical mechanical polishing (CMP) process.

Figure 1B:
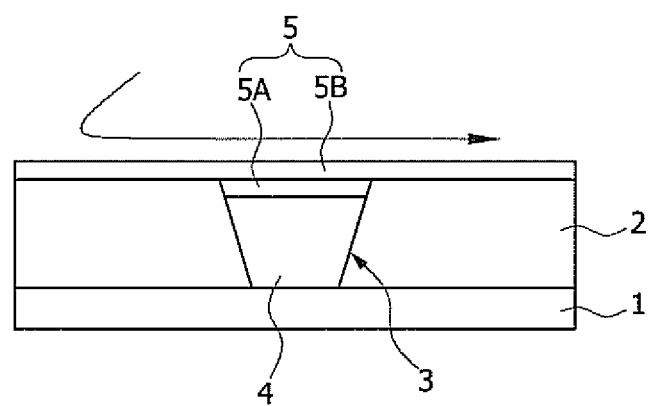

As illustrated in FIG. 1b, a second lower electrode layer 5B is formed on the substrate having the first lower electrode layer 5A formed thereon. The second lower electrode layer 5B may be TIN. Hereinafter, the first and second lower electrode layers 5A and 5B are commonly referred to as a lower electrode layer 5.

Figure 1C:
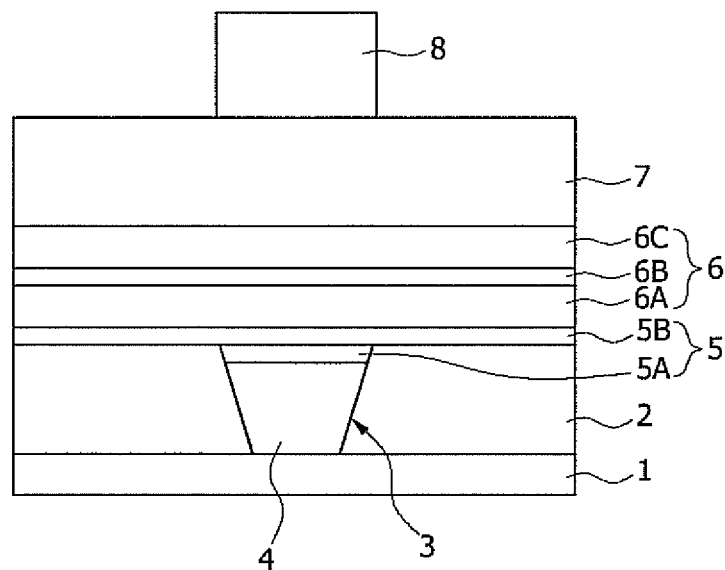

As illustrated in FIG. 1c, a magnetic tunnel junction layer 6, an upper electrode layer 7 and a mask pattern 8 are sequentially formed on the substrate having the lower electrode layer 5 formed thereon.

The magnetic tunnel junction layer 6 includes a fixed layer 6A, a tunnel insulating layer 6B and a free layer 6C. The fixed layer 6A is a layer of which magnetization direction is fixed in a first direction, and includes a pinning layer and a pinned layer. The pinning functions to fix the magnetization direction of the pinned layer. To this end, the pinning layer is formed of a thin film made of at least one selected from the group consisting of IrMn, PtMn, MnO, MnS, MnTe, $MnF_2$, $FeF_2$, $FeCl_2$, FeO, $CoCl_2$, CoO, $NICl_2$ and NiO. The magnetization direction of the pinned layer is fixed by the pinning layer. To this end, the pinned layer is formed of a thin film made of at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$. The tunnel insulating layer 6B may be a MgO layer. Alternatively, the tunnel insulating layer may be formed of a Group-IV semiconductor layer, or may be formed by adding a Group-III or Group V element such as B, P or As to the semiconductor layer so as to control the electric conductivity thereof. The free layer 6C is a layer of which magnetization direction is changed depending on a direction of current supplied thereto. The free layer 6C is formed of a thin film made of at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$.

The upper electrode layer 7 serves as a mask for patterning the magnetic tunnel junction layer 6, and protects the magnetic tunnel junction layer 6. The upper electrode layer 7 also serves as a wire for supplying current to the magnetic tunnel junction layer 6. To this end, the upper electrode layer 7 may be a laminated layer formed by laminating, for example, Ru, W and Ta.

The mask pattern 8 serves as a mask for patterning the upper electrode layer 7. To this end, the mask pattern 8 may be a thin film, e.g., photoresist, with which the upper electrode layer 7 is etched. Alternatively, the mask pattern 8 may have a structure in which an undoped silicate glass (USG) layer, a carbon layer and a photoresist pattern are laminated over the upper electrode layer 7.

Figure 1D:
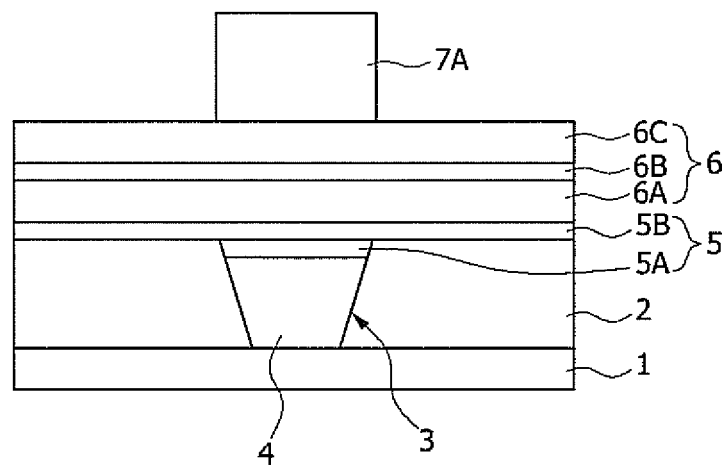

As illustrated in FIG. 1d, an upper electrode pattern 7A is formed by patterning the upper electrode layer 7 using the mask pattern 8 as an etch barrier. All or a portion of the mask pattern 8 may be lost during the etching process so that the mask pattern 8 is removed during the etching process. Alternatively, the mask pattern 8 may be removed through a separate process.

Figure 1E:
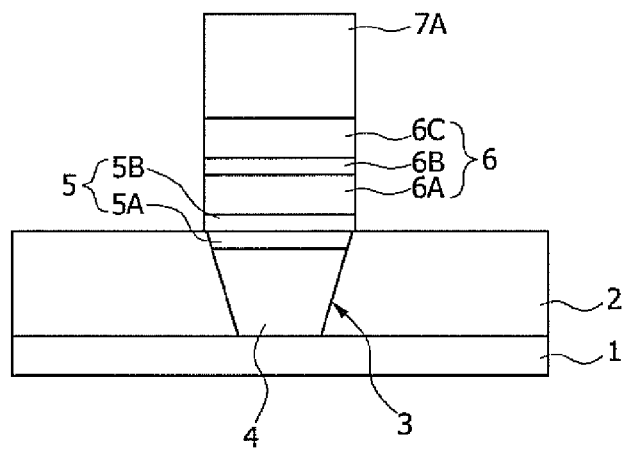

As illustrated in FIG. 1e, the magnetic tunnel junction layer 6 and the second lower electrode layer 5B are patterned using the upper electrode pattern 7A as an etch barrier.

The forming of the lower electrode 5 includes a process of burying the first lower electrode layer 5A in the first contact hole 3 and a process of depositing and planarizing the second lower electrode layer 5B. Meanwhile, when the magnetic tunnel junction pattern 6A is formed, the second lower electrode layer 5B is patterned together. In this case, the entire second lower electrode layer 5B on the first interlayer insulating layer 2 is removed for the purpose of providing insulation. According to an example, the thickness of the second lower electrode layer 5B is 50 Å or less. However, it is difficult to adjust the thickness of the second electrode layer 5B to be 50 Å or less due to the lack of a margin in the planarization process for determining the thickness of the second lower electrode layer 5B. Therefore, the second lower electrode layer 5B remains on the first interlayer insulating layer 2. In FIG. 1d, the remaining of the second lower electrode layer 5B may be avoided by increasing etching time. However, this may result in excessive damage of the upper electrode pattern 7A.

FIGS. 2a to 2e are sectional views illustrating a method for fabricating an STTRAM in accordance with an exemplary embodiment of the present invention.

Figure 2A:
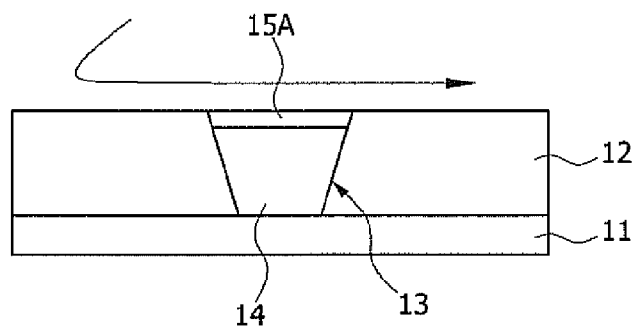
FIGS. 2a to 2f are sectional views illustrating a method for fabricating an STTRAM in accordance with an embodiment of the present invention.

As illustrated in FIG. 2a, a first interlayer insulating layer 12 is formed on a substrate having a bottom layer 11 formed thereon.

A transistor for selecting a magnetic tunnel junction is disposed on the bottom layer 11.

The first interlayer insulating layer 12 functions to insulate layers or elements from each other. To this end, the first interlayer insulating layer 12 may be at least one of a BSG layer, a BPSG layer, a PSG layer, a TEOS layer, an HDP oxide layer and an SOG layer.

Subsequently, a first contact hole 13 is formed by selectively etching the first interlayer insulating layer 12. The first contact hole 13 may be formed in a circular or polygonal shape.

Subsequently, a first contact plug 14 that contacts a source/drain region (S/D) of the transistor is formed by burying a conductive layer in the first contact hole 13.

In this case, an excessive etching process is performed on the conductive layer, so that a portion of the upper part of the first contact hole 13 is exposed. The first contact plug 14 functions to electrically connect the source/drain region (S/D) of the transistor and the magnetic tunnel junction to each other.

Subsequently, a first lower electrode layer 15A is buried in the exposed portion of the upper part of the first contact hole 13. That is, the first lower electrode layer 15A completely buried in the first contact hole 13 is formed by depositing TiN on the substrate and subsequently performing a planarization process. Here, the planarization process may be a CMP process.

Figure 2B:
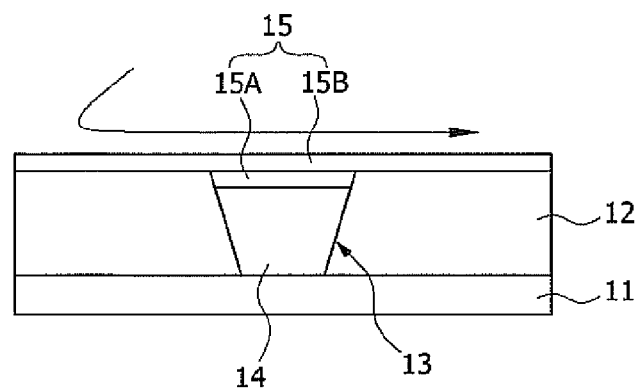

As illustrated in FIG. 2b, a second lower electrode layer 15B is formed on the substrate having the first lower electrode layer 15A formed thereon. The second lower electrode layer 15B may be one of Ta, Ti and TiN. When the second lower electrode layer 15B is formed of Ta, a surface of the second lower electrode layer 15B is planarized by depositing to a thickness of 100 Å or more and subsequently performing a planarization process. In this case, the roughness of a surface of the Ta is set to vary within 5 Å, and the thickness of the remaining Ta is adjusted to be 100 Å or less. Hereinafter, the first and second lower electrode layers 15A and 15B are commonly referred to as a lower electrode layer 15.

Meanwhile, after the second lower electrode layer 15B is formed, a native oxide existing on the second lower electrode layer 15B may be removed by performing a radio frequency (RF) etching process.

Figure 2C:
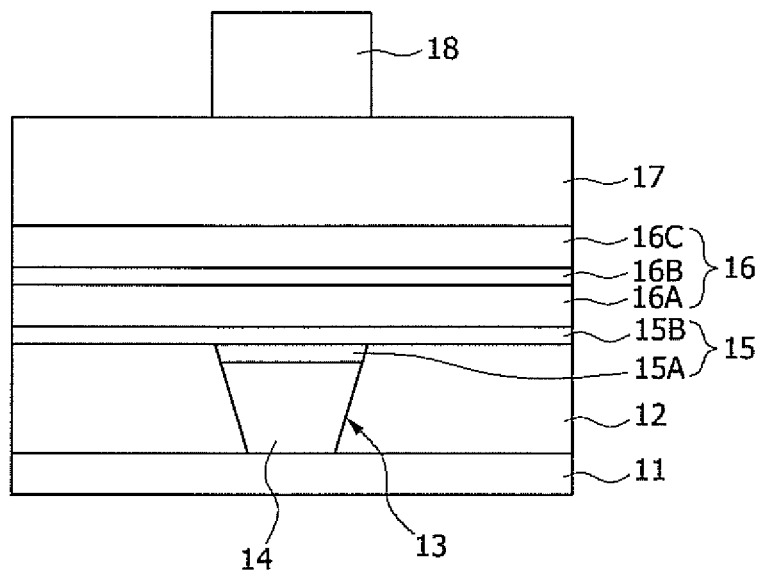

As illustrated in FIG. 2c, a magnetic tunnel junction layer 16, an upper electrode layer 17 and a mask pattern 18 are sequentially formed on the substrate having the lower electrode layer 15 formed thereon.

The magnetic tunnel junction layer 16 includes a fixed layer 16A, a tunnel insulating layer 16B and a free layer 16C. The fixed layer 16A is a layer of which magnetization direction is fixed in a first direction and includes a pinning layer and a pinned layer. The pinning layer functions to fix the magnetization direction of the pinned layer. To this end, the pinning layer is formed of a thin film made of at least one selected from the group consisting of IrMn, PtMn, MnO, MnS, MnTe, $MnF_2$, $FeF_2$, $FeCl_2$, FeO, $CoCl_2$, CoO, $NiCl_2$ and NiO. The magnetization direction of the pinned layer is fixed by the pinning layer. To this end, the pinned layer is formed of a thin film made of at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$. The tunnel insulating layer 16B may be a MgO layer. Alternatively, the tunnel insulating layer 16B may be formed of a Group-IV semiconductor layer or may be formed by adding a Group-III or Group V element such as B, P or As to the Group-IV semiconductor layer so as to control the electric conductivity thereof. The free layer 16C is a layer of which magnetization direction is changed depending on a direction of current supplied thereto. The free layer 16C is formed of a thin film made of at least one selected from the group consisting of Fe, Co, Ni, Gd, Dy, NiFe, CoFe, MnAs, MnBi, MnSb, $CrO_2$, $MnOFe_2O_3$, $FeOFe_2O_3$, $NiOFe_2O_3$, $CuOFe_2O_3$, EuO and $Y_3Fe_5O_{12}$.

The upper electrode layer 17 serves as a mask for patterning the magnetic tunnel junction layer 16 and protects the magnetic tunnel junction layer 16. The upper electrode layer 17 also serves as a wire for supplying current to the magnetic tunnel junction layer 16. To this end, the upper electrode layer 17 may be a laminated layer formed by laminating, for example, Ru, W and Ta.

The mask pattern 18 serves as a mask for patterning the upper electrode layer 17. According to an example, the mask pattern 8 may be a thin film, e.g., photoresist, with which the upper electrode layer 17 is etched. Alternatively, the mask pattern 18 may have a structure in which a USG layer, a carbon layer and a photoresist pattern are laminated over the upper electrode layer 17.

Figure 2D:
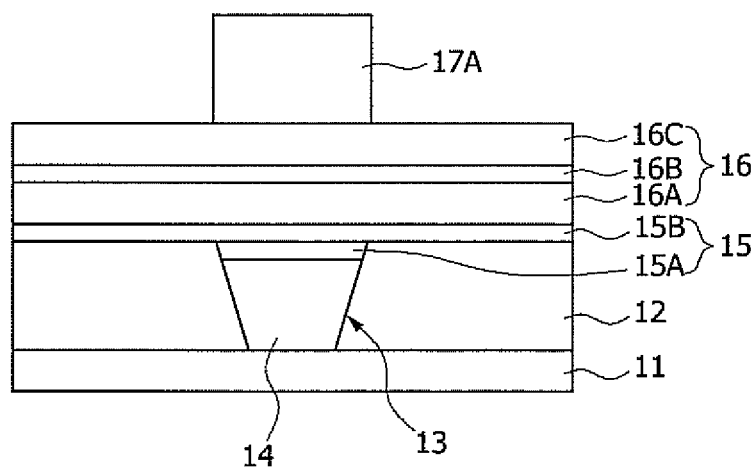

As illustrated in FIG. 2d, an upper electrode pattern 17A is formed by patterning the upper electrode layer 17 using the mask pattern 18 as an etch barrier in an etching chamber. All or a portion of the mask pattern 18 may be lost during the etching process so that the mask pattern 18 is removed during the etching process. Alternatively, the mask pattern 18 may be removed through a separate process.

Figure 2E:
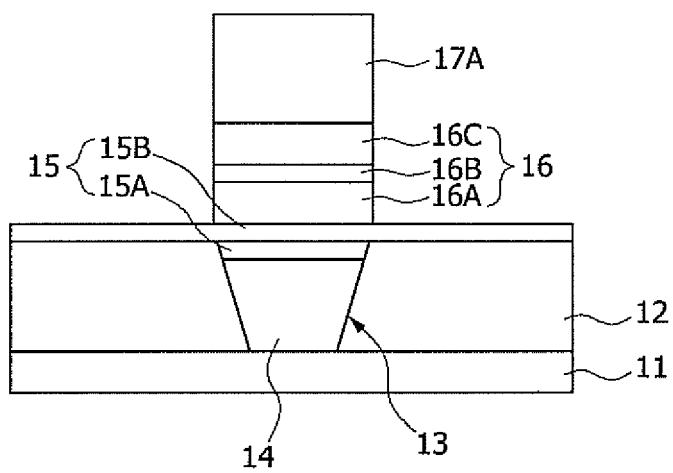
Figure 2F:
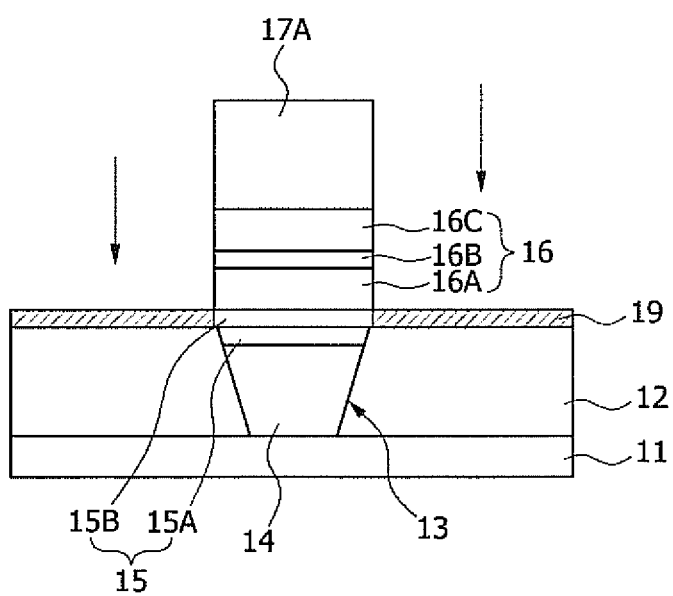

As illustrated in FIGS. 2e and 2f, a magnetic tunnel junction pattern 16A is formed by patterning the magnetic tunnel junction layer 16 using the upper electrode pattern 17A as an etch barrier, and at the same time, an insulating layer 19 is formed by oxidizing the second lower electrode layer 15B exposed at both sides of the magnetic tunnel junction pattern 16A.

The patterning of the magnetic tunnel junction layer 16 is performed using a wet etching process, and the etching gas used in the wet etching process may be $CH_3OH$ or gas in which CO and $NH_3$ are mixed together. By using the etching gas, the magnetic tunnel junction layer 16 is patterned, and, at the same time, the second lower electrode layer 15B is oxidized. That is, when the etching gas is continuously supplied to the inside of the etching chamber in an in-situ state, the insulating layer 19 may be formed by patterning the magnetic tunnel junction layer 16 and oxidizing the second lower electrode layer 15B at the same time. In this case, the time for etching the second lower electrode layer 15B is decreased, and thus, a processing time is decreased. Further, the second lower electrode layer 15B is not etched, and thus, etching damage of the upper electrode pattern 17A may be reduced.

The insulating layer 19 is a thin film in which electricity does not flow. The insulating layer 19 functions to insulate adjacent lower electrode layers 15 or magnetic tunnel junction layers 16. According to the exemplary embodiment of the present invention, the lower electrode layer 15 is separately formed not through etching but through oxidization. To this end, the Ta having an excellent insulation property against the oxidation is used as the second lower electrode layer 15B.

Accordingly, in the method for fabricating the STTRAM in accordance with the embodiment of the present invention, since the lower electrode layer 15 is not separated through etching but through oxidation, an etching failure due to loss of an etching margin is prevented. Further, since the second lower electrode layer 15B is not etched, etching damage of the upper electrode pattern 17 is reduced.

While the present invention has been described with respect to the specific embodiments, it will be apparent to those skilled in the art that various changes and modifications may be made without departing from the spirit and scope of the invention as defined in the following claims. For example, the process of etching a magnetic tunnel junction layer and the process of oxidizing a second lower electrode layer may be separately performed. When the processes are separately performed, the oxidation of the second lower electrode layer may be performed by etching the magnetic tunnel junction layer, supplying gas containing oxygen to the inside of a chamber and subsequently applying bias power.

In addition, the present invention may be identically applied to a method for fabricating an island or line type device, e.g., an ReRAM device, in which an etching margin is deficient in an etching process of a lower electrode layer.

What is claimed is:
1. A semiconductor device, comprising:
an interlayer insulating layer;
a contact plug and a first electrode that are each stacked in a hole penetrating the interlayer insulating layer;
a second electrode formed on the first electrode;

a magnetic tunnel junction element formed on the second electrode;

a third electrode formed on the magnetic tunnel junction element; and an insulating layer formed on a portion of the interlayer insulating layer excluding the hole penetrating the interlayer insulating layer by oxidizing the second electrode that is exposed at both sides of the magnetic tunnel junction element, wherein an etching damage of the third electrode is reduced by the oxidizing of the second electrode instead of an etching of the second electrode, and wherein the insulating layer and the second electrode are disposed in a same layer.

2. The semiconductor device of claim 1, wherein the insulating layer functions to insulate adjacent first and second electrodes or the magnetic tunnel junction element.

3. The semiconductor device of claim 1, wherein a magnetic tunnel junction pattern is formed by patterning the magnetic tunnel junction element using the metal oxidation layer as an etch barrier.

4. The semiconductor device of claim 3, wherein the first contact plug contacts a source region and a drain region formed by burying a conductive layer in the hole.

5. The semiconductor device of claim 4, wherein the magnetic tunnel junction element is patterned using an etching gas and the conductive layer is not patterned using the etching gas.

* * * * *